United States Patent
Zhang et al.

(10) Patent No.: US 6,897,731 B2
(45) Date of Patent: May 24, 2005

(54) METHOD AND CIRCUIT FOR OVERLOAD RECOVERY OF AN AMPLIFIER

(75) Inventors: Joy Y. Zhang, Tucson, AZ (US); Rodney T. Burt, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 35 days.

(21) Appl. No.: 10/693,765

(22) Filed: Oct. 24, 2003

(65) Prior Publication Data

US 2005/0088240 A1 Apr. 28, 2005

(51) Int. Cl.[7] ................................................ H02H 7/20
(52) U.S. Cl. ........................ 330/298; 330/291; 330/98
(58) Field of Search ................................ 330/298, 291, 330/98

(56) References Cited

U.S. PATENT DOCUMENTS

| | | | | |
|---|---|---|---|---|
| 3,582,675 A | * | 6/1971 | Jordan et al. ................ 327/376 |
| 3,668,545 A | * | 6/1972 | Von Recklinghausen ... 330/298 |
| 4,147,990 A | * | 4/1979 | Dokus et al. .................. 330/11 |
| 4,623,786 A | * | 11/1986 | Rodwell .................. 250/214 A |
| 6,201,442 B1 | * | 3/2001 | James et al. ................ 330/107 |

* cited by examiner

Primary Examiner—Patricia Nguyen
(74) Attorney, Agent, or Firm—W. Daniel Swayze, Jr.; W. James Brady; Frederick J. Telecky, Jr.

(57) ABSTRACT

A method and circuit for providing a faster overload recovery time for an amplifier circuit is provided. An overload recovery circuit is configured to reduce and/or eliminate the slow tail voltage that may be caused by overloading a composite amplifier, and thus provide a faster overload recovery time over a wide range of feedback components for the composite amplifier. The overload recovery circuit comprises a bypass device configured to provide a path for additional current to flow through during overload conditions, thus creating a "clamping" action with the feedback element of the amplifier circuit. As a result, the current flowing through the bypass device of the amplifier circuit will be large enough to hold an inverting node of the composite amplifier at the common mode voltage, thus reducing the overload recovery time. In addition, the overload recovery circuit can further comprise a stabilization circuit configured to stabilize the composite amplifier during overload condition by sensing when an overload condition is occurring, and modifying the feedback to the input terminals of the amplifier circuit to prevent oscillation.

30 Claims, 3 Drawing Sheets

METHOD AND CIRCUIT FOR OVERLOAD RECOVERY OF AN AMPLIFIER

TECHNICAL FIELD

The present invention relates, generally, to amplifiers. More particularly, the present invention relates to a method and circuit for overload recovery for an amplifier.

BACKGROUND OF THE INVENTION

In the efforts for optimizing and improving operation in various high-speed microcontroller-based devices, such as various instrumentation and measurement equipment and the like, significant attention has been given to the further improvement of the high-speed amplifiers utilized. Examples of high-speed amplifiers commonly utilized include inverting amplifiers, gain amplifiers, and transimpedance amplifiers. Transimpedance amplifiers can be used to convert low-level photodiode currents to usable voltage signals. Such transimpedance amplifiers are more commonly implemented within low current and leakage current measurement applications, as well as other low-level sensor current applications.

With reference to FIG. 1, a prior art composite amplifier circuit 100 as may be implemented within a transimpedance amplifier application is illustrated. Composite amplifier circuit 100 comprises a high-speed operational amplifier 102 configured for providing an output voltage at output terminal $V_{OUT}$. Composite amplifier circuit 100 can also comprise an integrator circuit including an auto-zero amplifier 104, a resistor $R_1$ and a capacitor $C_1$. Auto-zero amplifier 104 is configured for offset correction, e.g., correction of input voltage offset, of high-speed amplifier 102. Auto-zero amplifier 104 is coupled to the input terminals of high-speed amplifier 102, e.g., an inverting input terminal coupled through resistor $R_1$ to an inverting input terminal of high-speed amplifier 102, and an output terminal coupled to the non-inverting input terminal of high-speed amplifier 102. Capacitor $C_1$ is coupled between the inverting input terminal of auto-zero amplifier 104 and the non-inverting input terminal of high-speed amplifier 102.

With additional reference to FIG. 2, a prior art amplifier circuit 200 that may include a composite amplifier 102 configured within a transimpedance application is illustrated. For example, amplifier circuit 200 comprises a composite amplifier 202 having a high-speed amplifier 102 and an auto-zero amplifier 104 and configured with external feedback elements, such as resistor $R_0$ and capacitor $C_0$, coupled between an inverting input terminal and an output terminal of composite amplifier 202. In the transimpedance application, composite amplifier 202 can be coupled to a photo-diode device, represented by current source $I_D$ and parasitic capacitances $C_{PAR}$, through an inverting input terminal.

During operation of transimpedance amplifier circuit 200, it is desirable for the inverting input terminal of composite amplifier 202 to operate at common mode voltage, e.g., zero volts. However, when transimpedance amplifier circuit 200 is operating under an overload condition, with an output voltage close to a supply voltage, current flow within feedback resistor $R_0$ is limited. The input current flowing to transimpedance amplifier circuit 200 forces the node at the inverting input terminal of composite amplifier 202 to be pulled down below common mode voltage. This condition causes a charge to be added across capacitor $C_1$ of composite amplifier 202, and the output of transimpedance amplifier circuit 200 becomes saturated.

Once transimpedance amplifier circuit 200 transitions from the overload condition, the charge on capacitor $C_1$ of composite amplifier 202 slowly discharges due to the slow operation of auto-zero amplifier 104. As a result, a slow tail voltage is realized at output terminal $V_{OUT}$. This slow tail voltage causes an increase in the overload recovery time, thus reducing the dynamic range of transimpedance amplifier circuit 200.

One technique used to improve the overload recovery time is to limit the amount of current flowing within feedback resistor $R_0$ during overload condition through the use of a zener-based device configured in parallel with feedback resistor $R_0$ to clamp the voltage drop across feedback resistor $R_0$. Unfortunately, this zener-based device clamp configuration causes a "soft knee" affect in the output voltage of composite amplifier 202, generates errors within the normal operating region, and limits the transimpedance output signal dynamic range.

SUMMARY OF THE INVENTION

In accordance with various aspects of the present invention, a method and circuit for providing a faster overload recovery time for an amplifier circuit is provided. In accordance with an exemplary embodiment, an amplifier circuit comprises a composite amplifier and an overload recovery circuit. The overload recovery circuit is configured to reduce and/or eliminate the slow tail voltage that may be caused by overloading the composite amplifier, and thus provide a faster overload recovery time for the amplifier circuit over a wide range of feedback components for the composite amplifier.

In accordance with an exemplary embodiment, the overload recovery circuit comprises a bypass device. The bypass device is configured to provide a path for additional current to flow through during overload conditions, thus creating a "clamping" action with a feedback element of the amplifier circuit. As a result, the current flowing through the bypass device of the amplifier circuit will be large enough to hold an inverting node of the composite amplifier at the common mode voltage, thus reducing the overload recovery time.

In accordance with another exemplary embodiment, the overload recovery circuit further comprises a stabilization circuit configured to stabilize the composite amplifier during overload condition. The stabilization circuit senses when an overload condition is occurring, and modifies the feedback to the input terminals of the amplifier circuit to prevent oscillation. In accordance with an exemplary embodiment, the stabilization circuit comprises a clamp sensing element configured to sense when the bypass device is operating, and a stabilization network comprising one or more clamp stability devices configured to modify the feedback to the input terminals of the amplifier circuit.

In accordance with an exemplary embodiment, a method for reducing overload recovery time in an amplifier circuit comprises the steps of sensing when an overload condition exists at an output terminal of the amplifier circuit, and providing a path, for example through the bypass device, for additional current to flow through during said overload condition. In addition, the exemplary method may also include the step of stabilizing the amplifier circuit during said overload condition, such as through the sensing of an overload condition, and then modifying the feedback to the input terminals of the amplifier circuit.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE PRESENT INVENTION

The present invention may be described herein in terms of various functional components. It should be appreciated that such functional components may be realized by any number of hardware or structural devices configured to perform the specified functions. For example, the present invention may employ various integrated components, e.g., buffers, supply references, current sources, signal conditioning devices and the like, comprised of various electrical devices, e.g., resistors, transistors, capacitors, diodes and other components whose values may be suitably configured for various intended purposes. In addition, the present invention may be practiced in any integrated circuit application where an overload recovery condition is desirable. However for purposes of illustration only, exemplary embodiments of the present invention are described herein in connection with an inverting amplifier circuit, such as for a transimpedance amplifier. Further, it should be noted that while various components may be suitably coupled or connected to other components within exemplary circuits, such connections and couplings can be realized by direct connection between components, or by connection or coupling through other components and devices located thereinbetween.

In accordance with various aspects of the present invention, a method and circuit for providing a faster overload recovery time for an amplifier circuit is provided. In accordance with an exemplary embodiment, an amplifier circuit comprises a composite amplifier and an overload recovery circuit. The amplifier circuit can comprise any inverting amplifier, gain amplifier or any transimpedance amplifier configuration. In accordance with an exemplary embodiment, an amplifier circuit can comprise a composite amplifier configured in a transimpedance application with a high-speed amplifier and an auto-zero amplifier configuration, with various configurations and components. For example, with momentary reference to FIG. 5, a transimpedance amplifier circuit 500 can also be configured with chopper stabilization circuits, and/or without any such auto-zero or chopper stabilization circuits.

Figure 1:
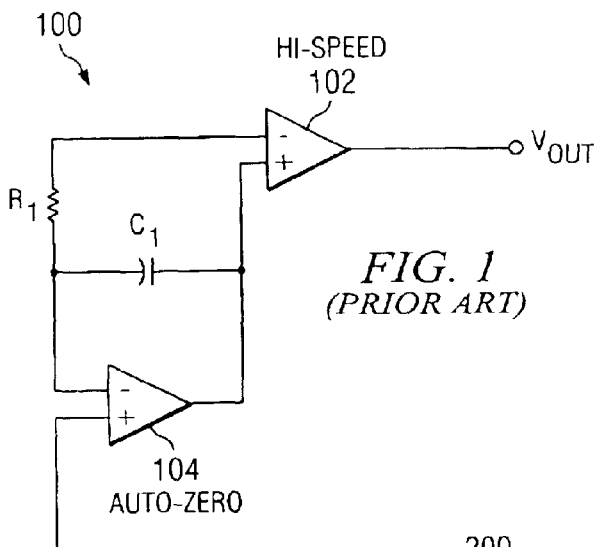
FIG. 1 illustrates a schematic diagram of a prior art composite amplifier.
Figure 2:
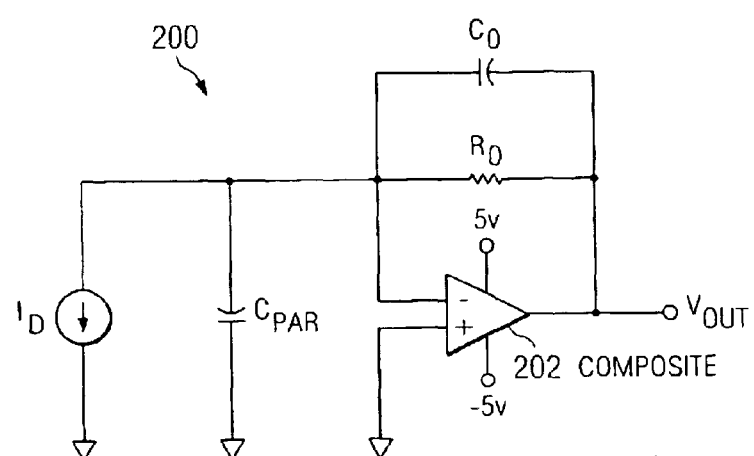
FIG. 2 illustrates schematic diagram of a prior art transimpedance amplifier circuit.
Figure 3:
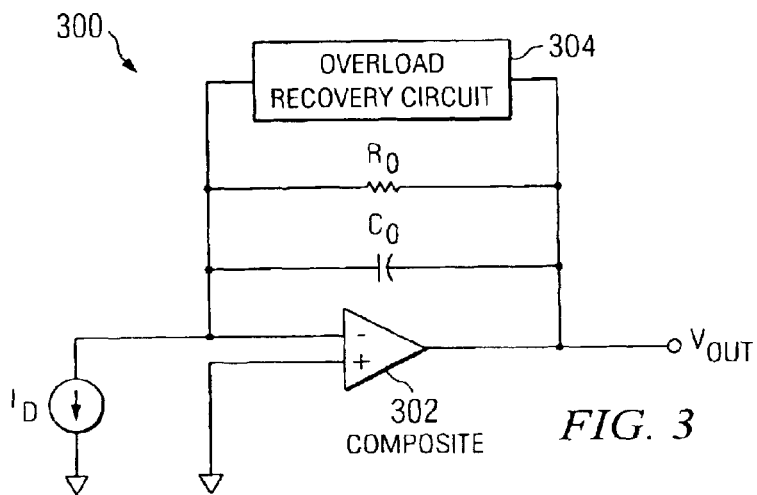
FIG. 3 illustrates a schematic and block diagram of an exemplary amplifier circuit comprising a composite amplifier with an overload recovery circuit in accordance with an exemplary embodiment of the present invention.

With reference to FIG. 3, an exemplary amplifier circuit 300 configured in a transimpedance amplifier application is illustrated. In accordance with an exemplary embodiment, amplifier circuit 300 suitably comprises a composite amplifier 302 comprising a high-speed amplifier and configured with external feedback elements comprising feedback resistor $R_O$ and feedback capacitor $C_O$ coupled between an inverting input terminal and an output terminal $V_{OUT}$. Composite amplifier 302 may also be configured without a feedback capacitor and/or a feedback resistor in various other embodiments. The feedback elements can be configured externally to amplifier circuit 300 in various manners. In an embodiment configured for transimpedance amplifier applications, composite amplifier 302 can be coupled to a photo-diode device, comprising a current source $I_D$ and parasitic capacitances coupled to the inverting input terminal of composite amplifier 302. Amplifier 300 can also comprise any other amplifier configuration, such as inverting amplifiers, gain amplifiers and the like.

However, transimpedance amplifier applications can more suitably realize the benefits of an overload recovery circuit. For example, with momentary reference again to FIG. 5, an amplifier circuit 500 suitably includes a composite amplifier comprising a high-speed amplifier 502 and an auto-zero amplifier 512. The inverting input terminal of high-speed amplifier 502 is configured through a direct connection to provide an input terminal INN of amplifier circuit 500, while an input terminal INP of amplifier circuit 500 can be coupled to the non-inverting input terminal of high-speed amplifier 502 through a non-inverting input terminal and an output terminal of auto-zero amplifier 512. The output terminal of auto-zero amplifier 512 can be suitably coupled through a low-pass filter comprising an RC network including resistor $R_2$ and capacitor $C_2$, with the low-pass filter being configured to reduce switching noise generated within auto-zero amplifier 512. However, in accordance with other exemplary embodiments, input terminals INN and INP of amplifier circuit 500 could both be directly connected to the inverting and non-inverting input terminals of high-speed amplifier 502, i.e., without auto-zero amplifier 512.

With reference again to FIG. 3, to facilitate a reduction in the overload recovery time for amplifier circuit 300, an overload recovery circuit 304 is configured to reduce and/or eliminate the slow tail voltage that may be caused by overloading composite amplifier 302, and thus provide a faster overload recovery time over a wide range of feedback components for composite amplifier 302, i.e., a wider range of values for feedback resistor $R_O$ and/or any feedback capacitor $C_O$.

In accordance with an exemplary embodiment, overload recovery circuit 304 comprises a bypass device configured to provide a path for additional current to flow through during overload conditions, instead of flowing through feedback resistor $R_O$. As a result, the bypass device creates a "clamping" action effect with feedback resistor $R_O$ of amplifier circuit 300. Accordingly, the current flowing through the bypass device of amplifier circuit 300 will be large enough to hold the inverting node of composite amplifier 302 at the common mode voltage.

An exemplary bypass device for overload circuit 304 can comprise various types of devices and circuits and can be configured in various arrangements. For example, in accordance with an exemplary embodiment, with reference to FIG. 4, an amplifier circuit 400 includes a composite amplifier 402 and an overload recovery circuit 404 comprising a bypass device 406. In this exemplary embodiment, bypass device 406 comprises a transistor $M_{PO}$ configured to provide a path for additional current to flow through instead of flowing within feedback resistor $R_O$ during overload conditions.

Transistor $M_{P0}$ has an input terminal, e.g., a source terminal, coupled to output terminal $V_{OUT}$, and an output terminal, e.g., a drain terminal, coupled to the inverting input terminal of operational amplifier 402. A control terminal, e.g., a gate terminal, of transistor $M_{P0}$ is coupled to a comparison control signal 412 to facilitate turning on of transistor $M_{P0}$ during overload condition. Various circuits and devices for generating comparison threshold signal 412 that can be used to determine when an overload condition is present.

Figure 5:
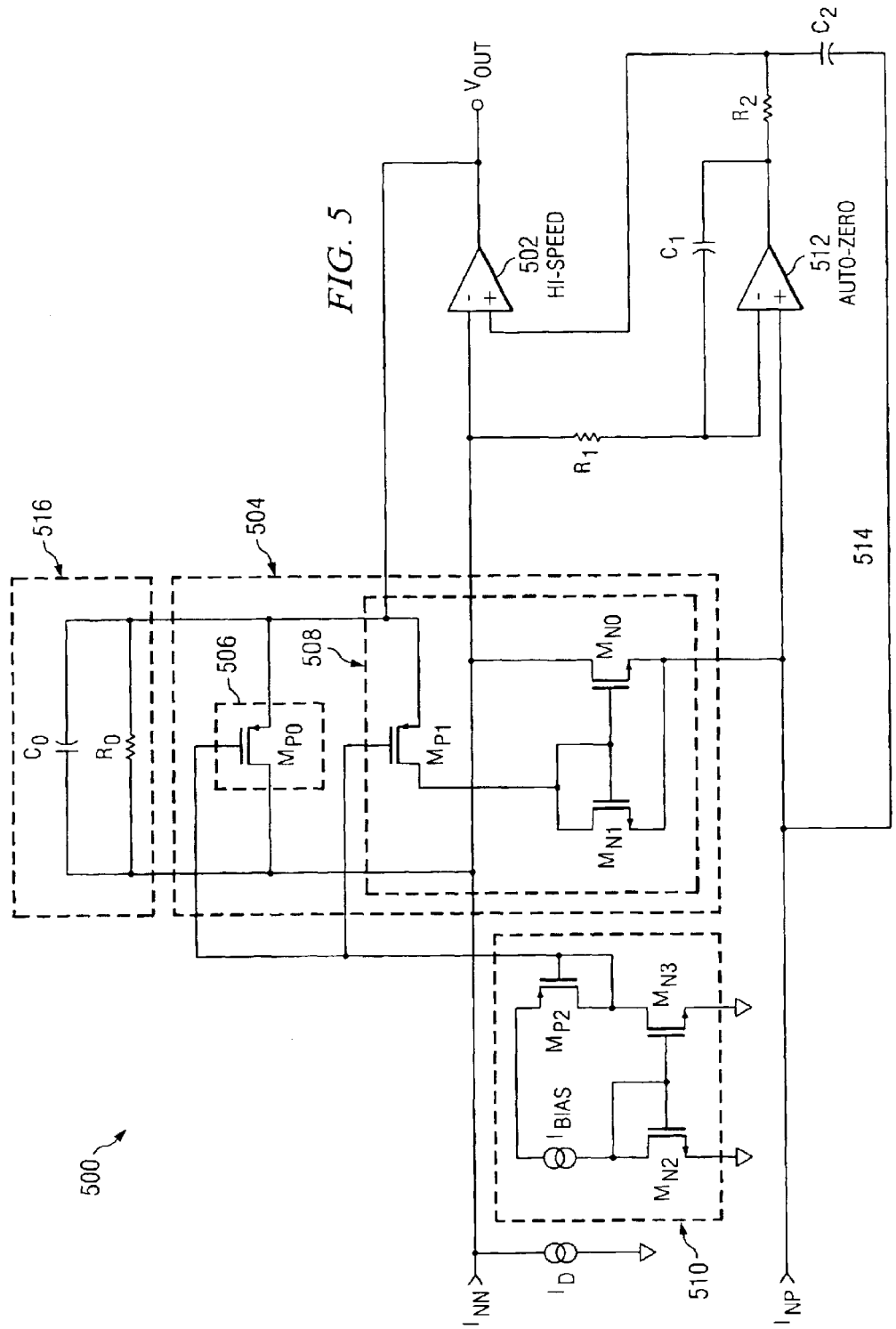
FIG. 5 illustrates a schematic diagram of an exemplary transimpedance amplifier circuit comprising a composite amplifier with an exemplary overload recovery circuit in accordance with another exemplary embodiment of the present invention.

For example in accordance with an exemplary embodiment, with momentary reference to FIG. 5, comparison control signal 412 can be provided by an bias circuit 510 comprising a current source $I_{BIAS}$, a pair of diode-connected transistors $M_{N2}$ and $M_{P2}$, and a third transistor $M_{N3}$. Bias circuit 510 is configured to set the gate voltage of transistor $M_{P0}$ to a comparison threshold voltage level, e.g., to comparison control signal 412 of approximately 4 volts with a supply voltage of approximately 5 volts. When the output voltage reaches a second threshold level representing an overload condition of a diode drop greater than comparison control signal, e.g., to approximately 4.7 volts or greater, transistor $M_{P0}$ will suitably turn on and thus provide a path for additional current to flow through instead of flowing within feedback resistor $R_0$. Thus, bias circuit 510 is configured to provide a comparison threshold control signal approximately a gate-source voltage or diode drop, e.g., approximately 0.7 volts, less than the second threshold level representing the overload voltage condition. Bias circuit 510 is not limited to that illustrated in FIG. 5 and can comprise any circuit configuration for providing a comparison threshold signal to facilitate turning on of bypass device 406 when an overload condition occurs.

With reference again to FIG. 4, during normal operating conditions, transistor $M_{P0}$ is effectively "open" or turned off, and thus does not affect operation of amplifier circuit 400, i.e., does not affect the resistance of feedback resistor $R_0$. Once an overload condition is present, transistor $M_{P0}$ is turned on, thus creating a "clamping" action to limit the amount of current flowing through feedback resistor $R_0$ of amplifier circuit 400. As a result, the current flowing through transistor $M_{P0}$ will be large enough to hold an inverting node of composite amplifier 402 at the common mode voltage, thus reducing the overload recovery time.

Figure 4:
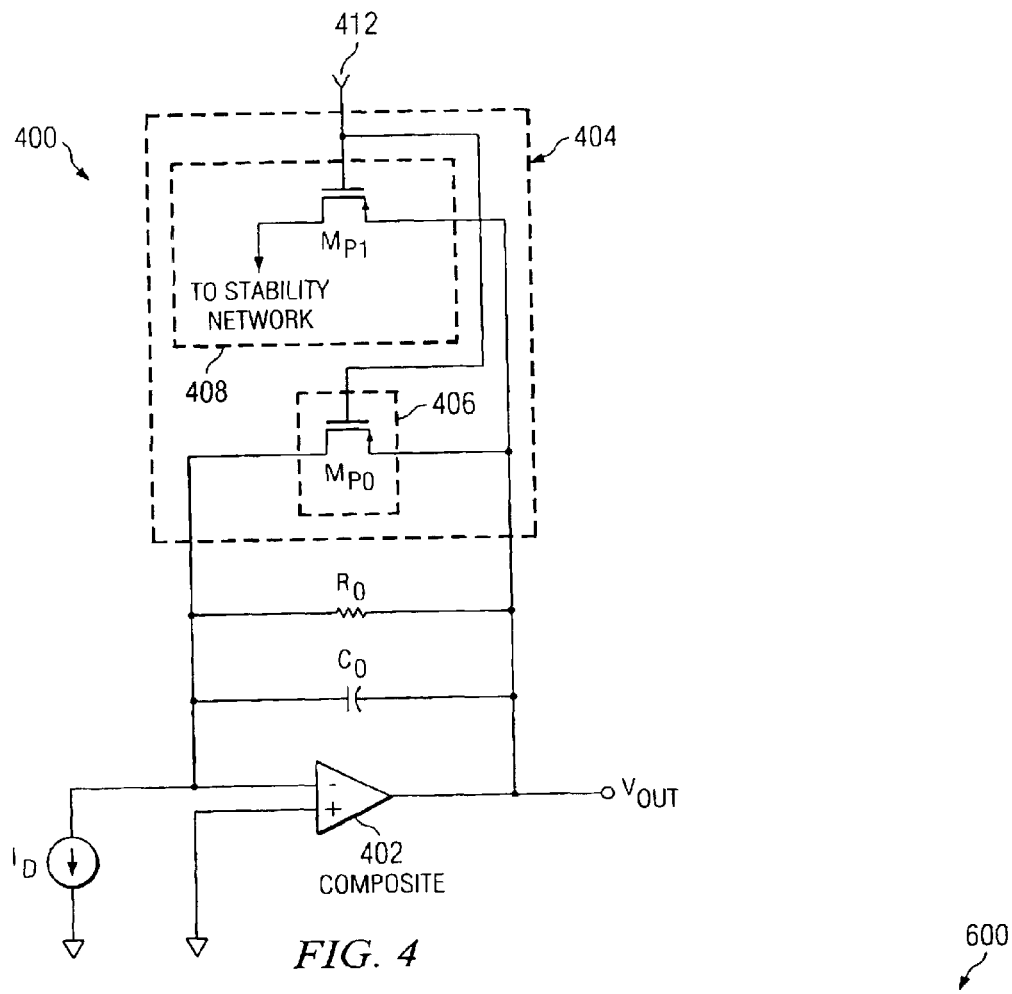
FIG. 4 illustrates a schematic diagram of an exemplary amplifier circuit comprising a composite amplifier with an exemplary overload recovery circuit in accordance with another exemplary embodiment of the present invention.

Although the exemplary embodiment of bypass device 406 illustrated in FIG. 4 comprises a transistor $M_{P0}$, bypass device 406 can comprise any device or circuit configured to provide a path for additional current to flow through instead of flowing within feedback resistor $R_0$ during overload conditions. For example, bypass device 406 can comprise switching devices, controlled or variable resistor devices, or any combination thereof, to provide a path for the additional current flowing during overload condition.

While bypass device 406 provides for the reduction of the overload recovery time, bypass device 406 can also affect the gain configuration of amplifier circuit 400 operating within a transimpedance amplifier configuration. In particular, bypass device 406 comprising transistor $M_{P0}$ tends to operate in a saturation region, as opposed to a triode region, thus adding gain to the feedback loop configuration of amplifier circuit 400. As a result, oscillation and other instability problems within amplifier circuit 400 can occur during overload condition.

To address instability concerns, in accordance with another exemplary embodiment, overload recovery circuit 404 can further comprise a stabilization circuit 408 configured to stabilize composite amplifier 400 during overload condition. Stabilization circuit 408 is configured to sense when an overload condition is occurring, and modifies the feedback to the input terminals of composite amplifier 402 to prevent oscillation. In accordance with an exemplary embodiment, stabilization circuit 408 comprises a clamp-sensing element configured to sense when bypass device 406 is operating, and a stabilization network configured to modify the feedback to the input terminals of amplifier circuit 400, such as by reducing the amount of feedback signal through shunting of the signal.

In an exemplary embodiment, the clamp sensing element comprises a transistor $M_{P1}$ having an input terminal, i.e., a source terminal, coupled to the source terminal of transistor $M_{P0}$, and a control terminal, e.g., a gate terminal, coupled go a first threshold control signal used for comparison to a second threshold level to turn on transistor $M_{P1}$ during overload condition. Transistor $M_{P1}$ also comprises an output terminal, e.g., a drain terminal, coupled to the one or more clamp stability devices configured to modify the feedback to the input terminals of amplifier circuit 400.

The comparison control signal for facilitating comparison and detection to an overload condition, and thus control of operation of transistor $M_{P1}$, can be provided by various circuits and devices; however in the exemplary embodiment, the control terminal of transistor $M_{P1}$ is coupled to the same comparison control signal 412 as the control terminal of transistor $M_{P0}$. For example, with momentary reference again to FIG. 5, the control terminal of transistor $M_{P1}$ can be coupled to bias circuit 510 to suitably facilitate the turning on of transistor $M_{P1}$ during overload condition.

The stabilization network is configured to modify the feedback to the input terminals of amplifier circuit 400. In accordance with an exemplary embodiment, the stabilization network comprises one or more stability devices coupled to bypass device 406 and configured to reduce the amount of feedback signal, e.g., by shunting the feedback signal. The stabilization network can be suitably arranged in various manners.

For example, with reference to FIG. 5, a stabilization circuit 508 can include a clamp sensing element comprising a transistor $M_{P1}$ and a stabilization network comprising one or more stability devices, such as transistors $M_{N0}$ and $M_{N1}$. Transistor $M_{N1}$ comprises a diode-connected device having a gate-drain connection coupled to the output terminal of clamp sensing element, transistor $M_{P1}$, such that any current flowing through transistor $M_{P1}$ suitably creates a gate-source voltage $V_{GS}$ on transistor $M_{N1}$ Instead of diode-connected device comprising transistor $M_{N1}$, the stabilization network can comprise any diode-configuration, or any other configuration to provide a gate voltage to enable transistor $M_{N0}$.

Transistor $M_{N0}$ is configured across input terminals INN and INP of amplifier circuit 500. For example, an input terminal, e.g., a source terminal, of transistor $M_{N0}$ is coupled to the non-inverting input terminal of high-speed amplifier 502, e.g., through a non-inverting input terminal and output terminal of auto-zero amplifier 512, while an output terminal, e.g., a drain terminal, of transistor $M_{N0}$ is coupled to the inverting input terminal of high-speed amplifier 502. A control terminal of transistor $M_{N0}$ is also suitably coupled to gate-drain connection of transistor $M_{N1}$, i.e., also coupled to the output terminal of clamp sensing element, transistor $M_{P1}$. Accordingly, as current flowing through transistor $M_{P1}$ suitably creates a gate-source voltage $V_{GS}$ to turn on transistor $M_{N1}$, similar gate-source voltage $V_{GS}$ is provided to turn on transistor $M_{N0}$. Once turned on, transistor $M_{N0}$ is configured to operate within the triode region, thus acting as a resistance between input terminals INN and INP of amplifier circuit 500. Although transistor $M_{N0}$ is illustrated in this exemplary embodiment, the stabilization network can comprise any switch configuration for providing a resistance for modifying the feedback to input terminals INN and INP of amplifier circuit 500.

Having illustrated various exemplary embodiments for an overload recovery circuit for an amplifier, an exemplary method for overload recovery in an exemplary amplifier circuit can be provided. With continued reference to FIG. 5, as an input voltage is applied to input terminals INN and INP, amplifier circuit 500 will suitably provide an amplified signal at the output terminal $V_{OUT}$. Meanwhile, bias circuit 510 will suitably provide a first level threshold comparison control signal, e.g., an approximately 4 volt signal or any other signal representative of a comparison threshold signal, to the control terminals of bypass device 506 and the clamp sensing element comprising transistor $M_{P0}$ of stabilization circuit 508.

Figure 6:
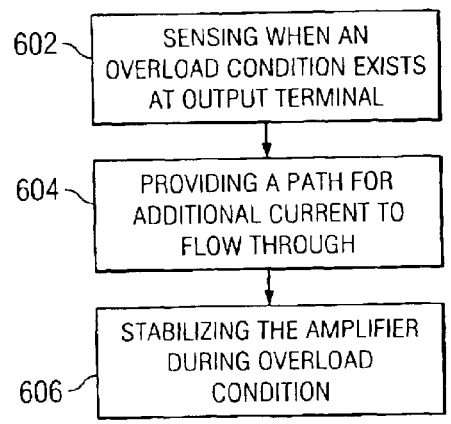
FIG. 6 illustrates a block diagram of an exemplary method for overload recovery in an amplifier circuit.

During normal operation, as the output voltage is less than the first level control signal of 4 volts plus a diode drop or gate-source voltage drop, bypass device 506 will be turned off or effectively opened and will provide essentially no effect to amplifier circuit 500, i.e., no effect to the resistance of feedback resistor $R_0$, and the clamp-sensing element will also remain turned off. However, with reference to FIG. 6 for an exemplary method 600 for reducing overload recovery time in amplifier circuit 500, once the output voltage reaches an overload condition, e.g., a gate-source voltage $V_{GS}$ of approximately 0.7 volts above the first level comparison control signal, an overload condition exists at an output terminal of amplifier circuit 500 and is sensed in a step 602. Once the overload condition is sensed or detected, bypass device 506 and the clamp-sensing element will be turned on. As bypass device 506 is turned on, a path is provided in a step 604, for example through bypass device 506, for additional current to flow through during the overload condition. For example, an additional path is provided in parallel to feedback resistor $R_0$ to allow for additional current to flow through bypass device 506 instead of within feedback resistor $R_0$.

In addition, exemplary method 600 may also include a step 606 of stabilizing amplifier circuit 500 during the overload condition, such as through the sensing of an overload condition, and then modifying the feedback to input terminals INN and INP of amplifier circuit 500. For example, as clamp-sensing element is turned on, current flowing through transistor $M_{P1}$ suitably creates a gate-source voltage $V_{GS}$ to turn on transistors $M_{N0}$ and $M_{N1}$, thus enabling transistor $M_{N0}$ to operate as a resistance between input terminals INN and INP of amplifier circuit 500. As a result, oscillation and stability concerns for amplifier circuit are suitably addressed during overload condition.

In summary, an overload recovery circuit is configured to reduce and/or eliminate the slow tail voltage that may be caused by overloading the composite amplifier, and thus provide a faster overload recovery time for an amplifier circuit over a wide range of feedback components. In accordance with an exemplary embodiment, the overload recovery circuit comprises a bypass device configured to provide a path for additional current to flow through during overload conditions, thus creating a "clamping" action with a feedback element of the amplifier circuit. As a result, the current flowing through the feedback element of the amplifier circuit will be large enough to hold an inverting node of the composite amplifier at the common mode voltage, thus reducing the overload recovery time. In accordance with another exemplary embodiment, the overload recovery circuit further comprises a stabilization circuit configured to stabilize the composite amplifier during overload condition. The stabilization circuit senses when an overload condition is occurring, and modifies the feedback to the input terminals of the amplifier circuit to prevent oscillation.

The present invention has been described above with reference to various exemplary embodiments. However, various other changes and modifications may be made to the exemplary embodiments without departing from the scope of the present invention. For example, the values and device sizes of the various resistors, capacitors and transistors can comprise numerous configurations, depending on a particular application and related design criteria. In addition, any type of transistor devices configured for performing the intended functions can be utilized. For example, the various transistor devices can comprise MOS, JFET, bipolar junction or any other type of transistor configuration. These and other changes or modifications are intended to be included within the scope of the present invention, as set forth in the following claims.

What is claimed is:

1. An amplifier circuit configured for use within high-speed applications, said amplifier circuit comprising:
    a composite amplifier having a feedback element and a pair of input terminals for receiving an input voltage, and an output terminal configured to provide an output voltage; and
    an overload recovery circuit configured for facilitating a faster overload recovery of said composite amplifier when said output voltage reaches an overload condition, said overload recovery circuit comprising:
        a bypass device coupled in parallel with said feedback element, said bypass device configured to provide a path for additional current to flow through during said overload condition; and
        a stabilization circuit configured for stabilizing said composite amplifier during said overload condition to prevent oscillation.

2. The amplifier circuit according to claim 1, wherein said bypass device comprises a transistor device having an input terminal coupled to said output terminal of said composite amplifier, and an output terminal coupled to an inverting input terminal of said composite amplifier.

3. The amplifier circuit according to claim 2, wherein said bypass device further comprises a control terminal coupled to an threshold comparison control signal configured to facilitate detection of said overload condition to turn on said bypass device when said overload condition is reached.

4. The amplifier circuit according to claim 3, wherein said threshold comparison control signal is generated by a bias circuit comprising a current source coupled to a pair of diode-connected transistor devices, and a third transistor device configured between said pair of diode-connected transistor devices.

5. The amplifier circuit according to claim 1, wherein said stabilization circuit is configured to modify feedback to said pair of input terminals.

6. The amplifier circuit according to claim 5, wherein said stabilization circuit comprises:
    a clamp sensing element configured to sense when said bypass device is providing said path for current flow; and
    a stabilization network configured to modify feedback to said pair of input terminals of said composite amplifier.

7. The amplifier circuit according to claim 6, wherein said clamp sensing element comprises a transistor device having an input terminal coupled to said output terminal of said composite amplifier, and an output terminal coupled to said stabilization network.

8. The amplifier circuit according to claim 7, wherein said clamp sensing element further comprises a control terminal configured to receive an overload control signal configured to turn on said clamp sensing element when said overload condition is reached.

9. The amplifier circuit according to claim 5, wherein said stabilization circuit is suitably controlled by a control signal also configured to control operation of said bypass device.

10. The amplifier circuit according to claim 6, wherein said stabilization network comprises a diode device and a switch device.

11. The amplifier circuit according to claim 10, wherein said diode device comprises a diode-connected transistor, and said switch device comprises a transistor having a control terminal coupled to a control terminal of said diode-connected transistor.

12. The amplifier circuit according to claim 1, wherein said composite amplifier further comprises a high-speed amplifier comprising said pair of input terminals and an auto-zero amplifier circuit having an output terminal coupled to one of said pair of input terminals of said high-speed amplifier.

13. An overload recovery circuit for facilitating a reduction in overload recovery time of an amplifier circuit, said overload recovery circuit comprising:

a bypass device configured for coupling in parallel with a feedback element of the amplifier circuit, said bypass device configured to provide a path for additional current to flow through during an overload condition instead of flowing through the feedback element; and a stabilization circuit configured for stabilizing said amplifier circuit during said overload condition to prevent oscillation.

14. The overload recovery circuit according to claim 13, wherein said bypass device comprises a transistor device having an input terminal configured for coupling to an output terminal of the amplifier circuit, an output terminal configured for coupling to an inverting input terminal of the amplifier circuit, and a control terminal configured to receive an overload control signal for turning on said bypass device when said overload condition is reached.

15. The overload recovery circuit according to claim 14, wherein said overload control signal is generated by a bias circuit comprising a current source coupled to a pair of diode-connected transistor devices, and a third transistor device configured between said pair of diode-connected transistor devices.

16. The overload recovery circuit according to claim 13, wherein said stabilization circuit is configured to modify feedback to a pair of input terminals of said amplifier circuit.

17. The overload recovery circuit according to claim 16, wherein said stabilization circuit comprises:

a clamp sensing element configured to sense when said bypass device is providing said path for current flow; and a stabilization network configured to modify the feedback to the pair of input terminals of the amplifier circuit.

18. The overload recovery circuit according to claim 17, wherein said clamp sensing element comprises a transistor device having an input terminal coupled to said output terminal of said composite amplifier, and an output terminal coupled to said stabilization network, and a control terminal configured to receive an overload control signal for turning on said clamp sensing element when said overload condition is reached.

19. The overload recovery circuit according to claim 16, wherein said stabilization circuit is suitably controlled by a control signal also configured to control operation of said bypass device.

20. The overload recovery circuit according to claim 17, wherein said stabilization network comprises a diode-connected transistor, and a switch transistor having a control terminal coupled to a control terminal of said diode-connected transistor, said transistor switch configured to modify feedback to the pair of input terminals of the amplifier circuit.

21. A method for reducing overload recovery time in an amplifier circuit, said method comprising the steps of:

sensing when an overload condition exists at an output terminal of said amplifier circuit;

providing through a bypass device a path for additional current to flow through during said overload condition; and stabilizing said amplifier circuit during said overload condition.

22. The method according to claim 21, wherein said sensing step comprises providing a control signal representative of said overload condition to a control terminal of said bypass device such that said bypass turns on when said overload condition occurs.

23. The method according to claim 21, wherein said step of providing said path through said bypass device comprises providing said path in parallel to a feedback resistor of said amplifier circuit.

24. The method according to claim 21, wherein said step of stabilizing said amplifier circuit during said overload condition comprises modifying feedback to input terminals of the amplifier circuit.

25. The method according to claim 24, wherein said step of stabilizing said amplifier circuit comprises sensing of said overload condition, and modifying feedback to the input terminals of the amplifier circuit.

26. The method according to claim 25, wherein said step of sensing of said overload condition comprises the same process as the step of sensing when an overload condition exists at an output terminal of said amplifier circuit.

27. The method according to claim 25, wherein said step of modifying feedback to the input terminals of said amplifier circuit comprises providing a resistance between the input terminals of said amplifier circuit.

28. A transimpedance amplifier circuit configured for reduced overload recovery time, said transimpedance amplifier circuit comprising:

a high-speed amplifier having an inverting input terminal and a non-inverting input terminal configured for receiving an input signal, an output terminal configured to provide an output voltage, and a feedback element coupled between said inverting input terminal and said output terminal, said inverting input terminal configured to provide a negative input terminal for said transimpedance amplifier circuit;

an auto-zero amplifier having an inverting input terminal coupled through at least one resistor to said inverting input terminal of said high-speed amplifier, a non-inverting input terminal configured to provide a positive input terminal for said transimpedance amplifier circuit, and an output terminal coupled to said non-inverting input terminal of said high-speed amplifier, said high-speed amplifier and said auto-zero amplifier configured to provide a composite amplifier; and an overload recovery circuit configured for facilitating a faster overload recovery time in said composite amplifier when said output voltage reaches an overload condition, said overload recovery circuit comprising:
   a bypass device coupled in parallel with said feedback element, said bypass device configured to provide a path for additional current to flow through during said overload condition; and
   a stabilization circuit configured to stabilize said composite amplifier to prevent oscillation.

29. The transimpedance amplifier according to claim 28, wherein said stabilization circuit comprises:
   a clamp sensing element configured to sense when said bypass device is providing said path for current flow; and
   a stabilization network configured to modify feedback to said negative input terminal and said positive input terminal of said transimpedance amplifier circuit.

30. An amplifier circuit comprising:
   a composite amplifier having a feedback element and an output terminal configured to provide an output voltage; and
   an overload recovery circuit configured for facilitating a faster overload recovery of said composite amplifier when said output voltage reaches an overload condition, said overload recovery circuit comprising:
      a bypass device coupled in parallel with said feedback element; and
      a stabilization circuit configured for stabilizing said composite amplifier during said overload condition.

* * * * *